United States Patent [19]

Kajikawa

[11] Patent Number: 4,896,203
[45] Date of Patent: Jan. 23, 1990

[54] HETEROJUNCTION BIPOLAR TRANSISTOR
[75] Inventor: Yasutomo Kajikawa, Itami, Japan
[73] Assignee: Mitsubishi Denki Kabushiki Kaisha, Tokyo, Japan
[21] Appl. No.: 235,277
[22] Filed: Aug. 23, 1988

Related U.S. Application Data

[62] Division of Ser. No. 97,165, Sep. 16, 1987.

[30] Foreign Application Priority Data

Sep. 25, 1986 [JP] Japan .................... 61-228724

[51] Int. Cl.⁴ .................... H01L 29/72; H01L 29/205
[52] U.S. Cl. ........................... 357/34; 357/16; 357/61
[58] Field of Search .............. 357/16, 34, 88, 60, 357/61

[56] References Cited

U.S. PATENT DOCUMENTS 4,338,138  7/1982  Cavaliere et al. ............ 357/34
4,591,398  5/1986  Ouchi et al. .................. 357/34
4,746,626  5/1988  Eda et al. ...................... 357/34

OTHER PUBLICATIONS

*IEEE Trans. on Electron Devices*, vol. ED-30, No. 10, Oct. 1983, "Consideration in Trans.", Tan et al, pp. 1289-1294.
Asbeck et al, "GaAs . . . Layers", *IEEE Elec. Dev. Letters*, vol. EDL-5, No. 8, Aug. 1984, pp. 310-312.

Primary Examiner—Andrew J. James
Assistant Examiner—Jerome Jackson, Jr.
Attorney, Agent, or Firm—Oblon, Spivak, McClelland, Maier & Neustadt

[57] ABSTRACT

In the inventive heterojunction bipolar transistor and method of manufacturing the same, a semi-insulation layer and an external base layer sequentially epitaxially grown on a collector layer are selectively mesa-etched through a mask of an insulation film provided with an opening so that the external base layer, the semi-insulation layer and the collector layer are selectively exposed, and thereafter an internal base layer and an emitter layer are selectively epitaxially grown in sequence on the exposed regions of an external base layer, the semi-insulation layer and the collector layer. An emitter electrode is formed in a self-alignment manner through the opening of the insulation film. Thus, transistor performance is improved and a precision element size is able to be obtained.

5 Claims, 4 Drawing Sheets

HETEROJUNCTION BIPOLAR TRANSISTOR

This is a division of application Ser. No. 097,165 filed Sept. 16, 1987.

BACKGROUND OF THE INVENTION

1. Field of the Invention

The present invention relates to a heterojunction bipolar transistor and a method of manufacturing the same, and more particularly, it relates to a heterojunction bipolar transistor and a method of manufacturing the same, which can improve transistor performance and precise element size.

2. Description of the Prior Art

FIG. 6 is a sectional view showing an example of a conventional heterojunction bipolar transistor, which is manufactured by a method described in IEEE Electron Device Letters, Vol. EDL-5 (1984), p. 310.

This heterojunction bipolar transistor is formed by a semi-insulative substrate 1 which is provided thereon with a subcollector layer 3 in a region enclosed by semi-insulation regions 2 for inter-element isolation. Semi-insulation layers 4 are provided on the subcollector layer 3 to enclose a collector layer 5. An internal base layer 6 is formed on the collector layer 5 and external base layers 7 are formed on the semi-insulation layers 4 respectively. An emitter layer 8 and a cap layer 9 are formed on the internal base layer 6. Base electrodes 10 are formed on the external base layers 7, while an emitter electrode 11 is formed on the cap layer 9 and a collector electrode 12 is formed on the subcollector layer 3 respectively. Semi-insulation regions 13 for inter-electrode isolation are formed between the base electrodes 10 and the emitter electrode 11.

Such a heterojunction bipolar transistor is generally manufactured in the following manner:

First, a subcollector layer 3, a collector layer 5, an internal base layer 6, an emitter layer 8 and a cap layer 9 are sequentially epitaxially grown on the semi-insulative substrate 1.

Then, photoresist patterns for forming the external base layers 7 through photolithography or the like are formed on the cap layer 9 to ion-implant, e.g., beryllium atoms by utilizing the photoresist patterns as masks, thereby to form the external base layers 7. Further, oxygen atoms are ion-implanted through the said photoresist patterns into regions deeper than the external base layers 7, to form the semi-insulation layers 4 directly under the external base layers 7.

Thereafter the ion-implanted regions are annealed, i.e., the ion-implanted impurities are activated through heat treatment. Then the base electrodes 10 are formed on the external base layers 7 and the emitter electrode 11 is formed on the cap layer 9 to be subjected to alloying processing respectively. In order to form the collector electrode 12, after a corresponding part with the collector electrode 12 is removed by selective etching to reach the subcollector layer 3, the collector electrode 12 are formed.

Finally, boron atoms, for example, are ion-implanted to form the semi-insulation regions 13 for inter-electrode isolation and the semi-insulation regions 2 for inter-element isolation.

However, such a conventional method of manufacturing the heterojunction bipolar transistor has the following disadvantages: Ion implantation and annealing must be performed in order to form the external base layers 7 and the semi-insulation layers 4 respectively, whereby crystal structure of the ion-implanted regions is broken and the impurities are diffused by the annealing after ion implantation, to lower the transistor performance. Further, the element size cannot be precisioned since ion implantation of the external base layers 7 and formation of the emitter and base electrodes 11 and 10 are not performed in a self-alignment manner.

SUMMARY OF THE INVENTION

The present invention is directed to a heterojunction bipolar transistor and a method of manufacturing the same.

The inventive heterojunction bipolar transistor comprises a semi-insulative substrate, a first conductivity type collector layer formed on the upper part of the semi-insulative substrate, a semi-insulation layer formed on the collector layer, a second conductivity type external base layer formed on the semi-insulation layer, an insulation film formed on the external base layer and provided with an opening in a required position, a cavity obtained by mesa etching regions of the external base layer, the semi-insulation layer and the collector layer corresponding to the opening of the insulation film which is utilized as a mask, a second conductivity type internal base layer formed on the exposed regions of the external base layer, the semi-insulation layer and the collector layer in the cavity, a first conductivity type emitter layer formed on the internal base layer in the cavity and an emitter electrode formed in a self-alignment manner through the opening of the insulation film to be electrically connected with the emitter layer.

The inventive method of manufacturing a heterojunction bipolar transistor comprises a first step of sequentially epitaxially growing a first conductivity type collector layer, a semi-insulation layer and a second conductivity type external base layer on the upper part of a semi-insulative substrate, a second step of forming a cavity in which the external base layer, the semi-insulation layer and the collector layer are exposed by performing selective mesa etching from the external base layer to the collector layer utilizing a selectively opened insulation film as a mask, a third step of sequentially growing a second conductivity type internal base layer and a first conductivity type emitter layer in the cavity by utilizing the insulation film as a mask and a fourth steop of forming an emitter electrode in a self-alignment manner through the opening of the insulation film.

Accordingly, a principal object of the present invention is to provide a heterojunction bipolar transistor and a method of manufacturing the same which can improve transistor performance as well as precise element size.

According to the present invention, the semi-insulation layer and the external base layer sequentially epitaxially grown on the collector layer are selectively mesa-etched to expose the external base layer, the semi-insulation layer and the collector layer and thereafter the internal base layer and the emitter layer are selectively epitaxially grown in sequence thereby to simultaneously attain collector-base junction and internal base-external base junction. In other words, the inventive method requires no ion implantation or annealing, whereby transistor performance can be improved with no problem such as breakage of crystal structure following ion implantation or impurity diffusion following annealing. Further, the emitter electrode is formed in a self-alignment manner through the pattern opening of the insulation film, whereby the element size can be fined.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
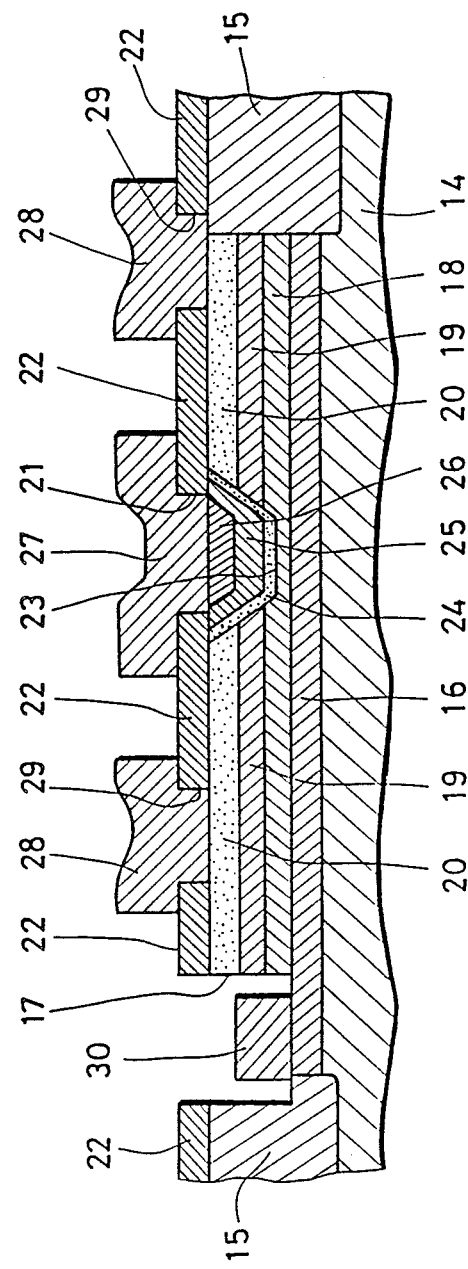
FIG. 1 is a sectional view showing a heterojunction bipolar transistor accordiing to an embodiment of the present invention.

FIG. 1 is a sectional view showing a heterojunction bipolar transistor according to an embodiment of the present invention. In the heterojunction bipolar transistor as shown in FIG. 1, an $n^+$-type subcollector layer 16 of GaAs is formed in a region enclosed by semi-insulation regions 15 for inter-element isolation on a semi-insulative substrate 14 of GaAs. An $n^-$-type collector layer 18 of GaAs is formed on the subcollector layer 16 to avoid an electrode cavity 17. A semi-insulation layer 19 is formed on the collector layer 18, while a $p^+$-type external base layer 20 of GaAs is formed on the semi-insulation layer 19. Further, an insulation film 22 having an opening 21 is formed on the external base layer 20. A cavity 23 is obtained by mesa etching regions of the external base layer 20, the semi-insulation layer 19 and the collector layer 18 corresponding to the opening 21 by utilizing the insulation film 22 as a mask, so that a $p^+$-type internal base layer 24 of GaAs, an n-type emitter layer 25 of AlGaAs and an $n^+$-type cap layer 26 of GaAs are sequentially formed in lamination in the cavity 23. An emitter electrode 27 is formed in a self-alignment manner through the opening 21 of the insulation film 22, to be connected with the cap layer 26 and the emitter layer 25. Base electrodes 28 are connected with the external base layer 20 via through holes 29 formed in the insulation film 22. A collector electrode 30 is connected with the subcollector layer 16 through the electrode cavity 17.

Description is now made on a method of manufacturing the heterojunction bipolar transistor.

Figure 2:
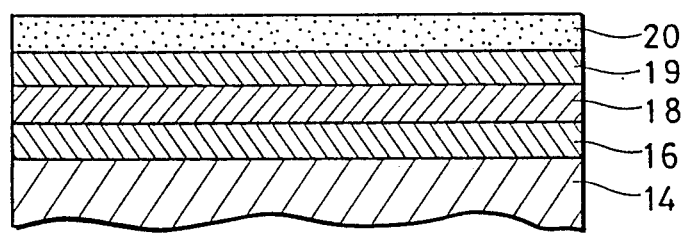
FIGS. 2 to 5 illustrate a method of manufacturing the heterojunction bipolar transistor.

First, a subcollector layer 16, a collector layer 18, a semi-insulation layer 19 and an external base layer 20 are sequentially epitaxially grown on a semi-insulative substrate 14 as shown in FIG. 2.

Figure 3:
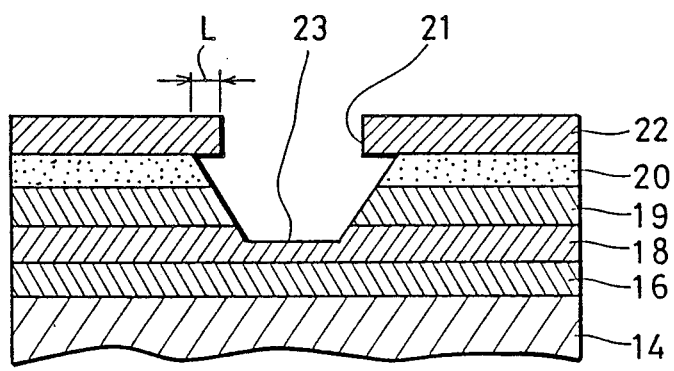

Then, as shown in FIG. 3, an insulation film 22 is deposited on the external base layer 20, to form an opening 21 in a required portion of the insulation film 22 through photolithography or the like. The insulation film 22 formed with the opening 21 is utilized as a mask to perform selective mesa etching from the external base layer 20 to the collector layer 18, to form a cavity 23 in which the external base layer 20, the semi-insulation layer 19 and the collector layer 18 are exposed. In the step as shown in FIG. 3, for example a (100) GaAs substrate may be employed to be etched by a solution of $4H_2SO_4/1H_2O_2/1H_2O$ to obtain $(\overline{1}10)$ section as shown in FIG. 3 (refer to Jpn. J. Appl. Phys. Vol. 25 (1986) L10).

Figure 4:
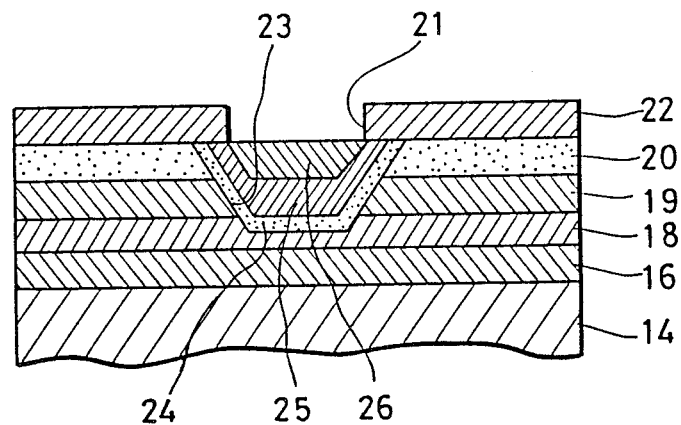

Thereafter the epitaxial layers are sequentially grown through organo-metal vapor phase epitaxy, for example, so that the epitaxial layers are not grown over the insulation film 22 but selectively grown only in the cavity 23 being a mesa-etched portion, whereby the respective epitaxial layers of an internal base layer 24, an emitter layer 25 and a cap layer 26 can be formed in the cavity 23 as shown in FIG. 4. In this case, the internal base layer 23 is formed to entirely cover the exposed regions of the external base layer 20, the semi-insulation layer 19 and the collector layer 18, while thickness of the internal base layer 23 is set to be smaller than width L of side etching of the cavity 23 as shown in FIG. 3, so that the internal base layer 23 is not in contact with an emitter electrode 27 to be thereafter formed. Through the aforementioned step, collector-base junction and internal base-external base junction are simultaneously attained.

Figure 5:
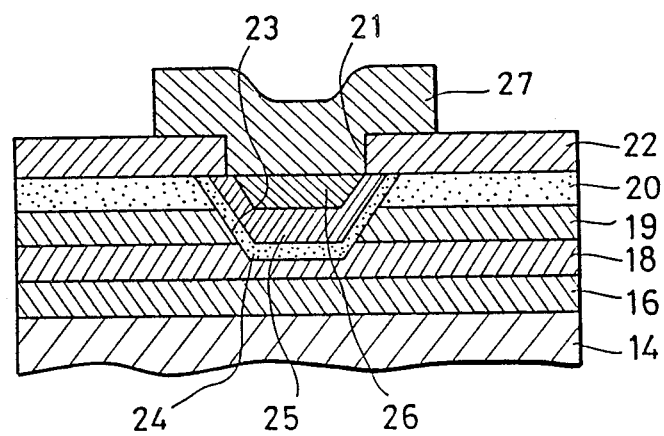
Figure 6:
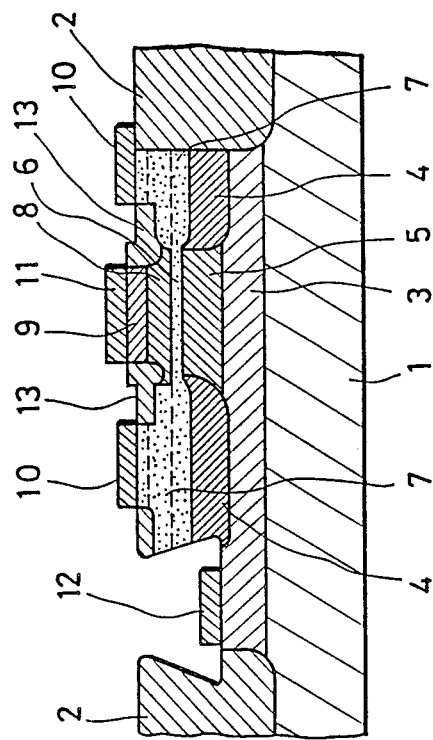
FIG. 6 is a sectional view showing a conventional heterojunction bipolar transistor.

Then, as shown in FIG. 5, the emitter electrode 27 is formed in a self-alignment manner through the opening 21 of the insulation film 22. Further, through holes 29 are formed in the insulation film 22 are shown in FIG. 1, to form base electrodes 28 to be connected with the external base layers 20 via the through holes 29. Further, an electrode cavity 17 is formed by etching or the like from the insulation film 22 to the subcollector layer 16, to form a collector electrode 30 on the exposed region of the subcollector layer 16 through the electrode cavity 17. Semi-insulation regions 15 for interelement isolation can be formed by ion-implanting boron atoms or the like into required regions after the subcollector layer 16, the collector layer 18, the semi-insulation layer 19 and the external base layer 20 are epitaxially grown on the semi-insulative substrate 14 as shown in FIG. 2, for example.

According to the aforementioned method, the semi-insulation layer 19 and the external base layer 20 sequentially epitaxially grown on the collector layer 18 are selectively mesa-etched to expose the external base layer 20, the semi-insulation layer 19 and the collector layer 18 thereby to selectively epitaxially grow the internal base layer 24, the emitter layer 25 and the cap layer 26 in sequence, whereby collector-base junction and internal base-external base junction can be simultaneously attained. In other words, the aforementioned method requires no ion implantation or annealing, whereby the transistor performance can be improved with no problem such as breakage of crystal structure following ion implantation or diffusion of impurities following annealing. Further, the emitter electrode 27 is formed in a self-alignment manner through the opening 21 of the insulation film 22, whereby the element size can be precisioned. In addition, the internal base layer 24 is formed independently of the external base layer 20 through selective epitaxial growth, whereby the external base layer 20 can be formed to be in large thickness and of high impurity concentration with no regard to the internal base layer 24, so that the resistance of the external base layer 20 can be set at a small value. Further, the external base layer 20 is formed in the uppermost part as an epitaxial layer, whereby the same can be easily brought into contact with the base electrodes 28 by simply providing the through holes 29 in the insulation film 22.

The present invention is also applicable to such case where the n-type and p-type conductivity types in the above embodiment are replaced by each other, as a matter of course.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A heterojunction bipolar transistor comprising:
   a semi-insulative substrate;
   a first conductivity type collector layer formed on the upper part of said semi-insulative substrate;
   a semi-insulation layer formed on said collector layer;
   a second conductivity type external base layer formed on said semi-insulation layer;
   an insulation film formed on said external base layer and provided with an opening in a required position;
   a cavity obtained by mesa etching regions of said external base layer, said semi-insulating layer and said collector layer corresponding to said opening of said insulation film being utilized as a mask;
   a second conductivity type internal base layer formed only on exposed said regions of said external base layer, said semi-insulation layer and said collector layer only in said cavity;
   a first conductivity type emitter layer formed on said internal base layer in said cavity; and
   an emitter electrode formed in a self-alignment manner through said opening of said insulation film to be electrically connected with said emitter layer.

2. A heterojunction bipolar transistor in accordance with claim 1, wherein
   a first conductivity type subcollector layer is further provided between said semi-insulative substrate and said collector layer.

3. A heterojunction bipolar transistor in accordance with claim 1, wherein
   a first conductivity type cap layer is further formed on said emitter layer in said cavity so that said emitter electrode is connected with said cap layer.

4. A heterojunction bipolar transistor in accordance with claim 1, wherein
   said insulation film is provided with a through hole so that a base electrode is connected with said external base layer via said through hole.

5. A heterojunction bipolar transistor in accordance with claim 2, wherein
   an electrode cavity is formed from said insulation film to said subcollector layer so that a collector electrode is formed in an exposed region of said subcollector layer in said electrode cavity.

* * * * *